United States Patent [19]

Nido et al.

[11] Patent Number: 5,425,042
[45] Date of Patent: Jun. 13, 1995

[54] REFRACTIVE INDEX CONTROL OPTICAL SEMICONDUCTOR DEVICE

[75] Inventors: Masaaki Nido; Akitaka Kimura, both of Tokyo, Japan

[73] Assignee: NEC Corporation, Japan

[21] Appl. No.: 259,436

[22] Filed: Jun. 14, 1994

[30] Foreign Application Priority Data

Jun. 25, 1993 [JP] Japan .................... 5-154039

[51] Int. Cl.6 .................... H01S 3/106; H01S 3/18
[52] U.S. Cl. .................... 372/45; 372/20
[58] Field of Search .................... 372/45, 20

[56] References Cited

U.S. PATENT DOCUMENTS

| | | | |
|---|---|---|---|
| 4,873,691 | 10/1989 | Uomi et al. | 372/45 |
| 5,081,634 | 1/1992 | Weisbuch et al. | 372/45 |
| 5,117,469 | 5/1992 | Cheung et al. | 372/45 |
| 5,177,758 | 1/1993 | Oka et al. | 372/45 |

OTHER PUBLICATIONS

Y. Sakata et al., pp. 4–202, Proceedings of the IEICE Spring Conference, Mar., 1993.
M.-C. Amann et al., pp. 253–254, Tuning Range and Threshold Current of the Tunable Twin-Guide (TTG) Laser, IEEE Photonics Technology Letters, vol. 1, No. 9, Sep. 1989.

*Primary Examiner*—Rodney B. Bovernick
*Assistant Examiner*—Yisun Song
*Attorney, Agent, or Firm*—Laff, Whitesel, Conte & Saret, Ltd.

[57] ABSTRACT

A refractive index control optical semiconductor device includes a semiconductor p-n junction structure, and a refractive index control semiconductor layer. The semiconductor p-n junction structure outputs light with a forward current. The refractive index control semiconductor layer is formed on a semiconductor substrate, is stacked on the semiconductor p-n junction structure to constitute an optical waveguide, causes a refractive index change of light to occur by carrier injection, and includes a multi-quantum well structure formed by alternately stacking a semiconductor quantum well layer and a barrier layer having a bandgap larger than that of the semiconductor quantum well layer at a plurality of periods. The semiconductor quantum well layer has a lattice constant smaller than that of the semiconductor substrate. The thickness of the semiconductor quantum well layer is set such that a lowest heavy hole sub-band and a lowest light hole sub-band of the semiconductor quantum well layer have nearly the same energy at a Γ-point in a wave number space.

5 Claims, 3 Drawing Sheets

REFRACTIVE INDEX CONTROL OPTICAL SEMICONDUCTOR DEVICE

BACKGROUND OF THE INVENTION

A semiconductor device, such as a tunable semiconductor laser or a refractive index control semiconductor optical modulator, which controls light by changing a refractive index by a current/voltage has become important in the field of optical communications. The present invention relates to an optical semiconductor device capable of largely changing a refractive index with a small current injection amount.

Refractive index control optical semiconductor devices of a prior art and the present invention will be described below using a wavelength tuning layer in a tunable semiconductor laser as an example. FIG. 5 shows the sectional structure of a tunable semiconductor laser, and FIG. 6 shows the layer structure of a wavelength tuning layer of the prior art (e.g., Y. Sakata et al., p. 4-202, Proceedings of the IEICE Spring Conference, March, 1993). Referring to FIG. 5, a tunable laser comprises a p-type InP buffer layer 15 stacked on a p-type InP substrate 14, a wavelength tuning layer 16 selectively formed on the p-type InP buffer layer 15, a multilayered structure 13 having a mesa-shaped section and consisting of an n-type InP layer (cladding layer) 17, a multi-quantum well active layer 18 having a bandgap wavelength of 1.55 μm and a semiconductor p-n junction structure for outputting a laser beam, and a p-type InP layer (cladding layer) 19, an n-type InP layer 20 for burying the multilayered structure 13 therein to horizontally and vertically form a double heterojunction on the p-type InP buffer layer 15, a trapezoidal p-type InP layer 21 and a trapezoidal p-type InGaAs layer 22 sequentially formed on the p-type InP layer 19 and the n-type InP layer 20 therearound, an insulating layer 23 formed on the surfaces of the p-type InGaAs layer 22 and the n-type InP layer 20 and on the side surface of the p-type InP layer 21 such that the p-type InGaAs layer 22 and the n-type InP structure 20 are partially exposed, p-type electrodes 24 and 25 formed on the p-type InGaAs layer 22 exposed from the insulating layer 23 and on the lower surface of the p-type InP substrate 14, respectively, and an n-type electrode 26 formed on the n-type InP layer 20 exposed from the insulating layer 23. A diffraction grating 27 for selecting an oscillation wavelength in a laser resonator direction is formed at the interface between the p-type InP buffer layer 15 and the wavelength tuning layer 16. A current is injected into the active layer 18 using the p- and n-type electrodes 24 and 26 to output light. Independently of the current of the active layer, a current is caused to flow in the wavelength tuning layer 16 using the p- and n-type electrodes 25 and 26 so as to inject carriers into the wavelength tuning layer. The wavelength tuning layer 16 serving as a refractive index control optical semiconductor layer has a refractive index which changes due to current injection, and the equivalent refractive index of an optical waveguide constituted by the active layer 18, the n-type InP layer 17, and the wavelength tuning layer 16 changes. As a result, the optical pitch of the diffraction grating 27 changes, and a laser oscillation wavelength changes.

Referring to FIG. 6, the wavelength tuning layer 16 comprises a three-period multi-quantum well layer and an InGaAsP guide layer 31 having a thickness of 200 nm and a bandgap wavelength of 1.29 μm. The three-period multi-quantum well layer is constituted by an InGaAsP guide layer 28 having a thickness of 20 nm and a bandgap wavelength of 1.29 μm, InGaAsP quantum well layers 29 each having a thickness of 10 nm and a bandgap wavelength of 1.45 μm, and InGaAsP barrier layers 30 each having a thickness of 20 nm and a bandgap wavelength of 1.29 μm. All the semiconductor layers are lattice-matched with the p-type InP substrate 14. A refractive index change of the wavelength tuning layer 16 caused by carrier injection occurs due to an anomalous dispersion change caused by band filling of the InGaAsP quantum well layers 29 and a plasma dispersion change of carriers of the entire area of the wavelength tuning layer 16. However, the contributions of the two dispersion components to the wavelength tuning layer 16 are equal to each other. When such a wavelength tuning layer is used, a wavelength change of about 3 nm can be obtained with a wavelength tuning current of 0 to 50 mA.

In the prior art, main factors for limiting a wavelength tuning amount are heat generation of an element caused by a wavelength tuning current and a laser optical loss caused by inter-valence band absorption in the wavelength tuning layer. The former increases with an increase in wavelength tuning current, and the latter increases with an increase in carrier density of the wavelength tuning layer. As a result, a laser output decreases with an increase in tuning current. In addition, although a refractive index change of the wavelength tuning layer depends on the carrier density of the wavelength tuning layer, the relationship between a current density (J) and the carrier density (N) is given by $J = eN/\tau$, and the current density considerably depends on a carrier lifetime $\tau$. In this case, e represents an elementary electric charge. Since the carrier lifetime decreases with an increase in carrier density, a current required for increasing a unit carrier density increases with an increase in carrier density. Therefore, the maximum amount of a wavelength tuning current with which a practical laser output can be obtained is about 50 mA.

SUMMARY OF THE INVENTION

It is an object of the present invention to provide a refractive index control optical semiconductor device capable of obtaining a large refractive index change with a small current.

It is another object of the present invention to provide a tunable semiconductor laser having a laser output which does not decrease even when a wavelength tuning amount increases.

In order to achieve the above objects, according to the present invention, there is provided a refractive index control optical semiconductor device comprising a semiconductor p-n junction structure for outputting light with a forward current, and a refractive index control semiconductor layer which is formed on a semiconductor substrate, is stacked on the semiconductor p-n junction structure to constitute an optical waveguide, causes a refractive index change of light to occur by carrier injection, and includes a multi-quantum well structure formed by alternately stacking a semiconductor quantum well layer and a barrier layer having a bandgap larger than that of the semiconductor quantum well layer at a plurality of periods, the semiconductor quantum well layer having a lattice constant smaller than that of the semiconductor substrate, and a thickness of the semiconductor quantum well layer being set such that a lowest heavy hole sub-band and a lowest light hole sub-band of the semiconductor quantum well layer have nearly the same energy at a Γ-point in a wave number space.

DESCRIPTION OF THE PREFERRED EMBODIMENT

Figure 1:
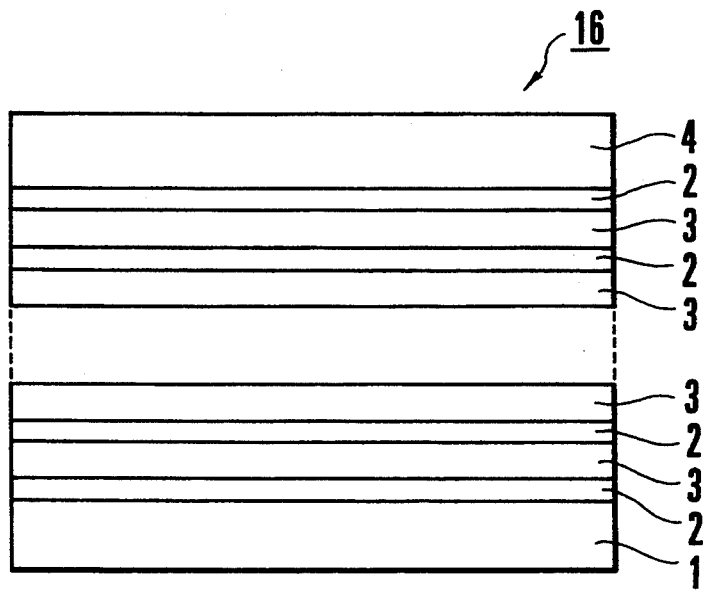
FIG. 1 is a view showing the layer structure of a refractive index control semiconductor structure in an optical semiconductor device according to the present invention.
Figure 2:
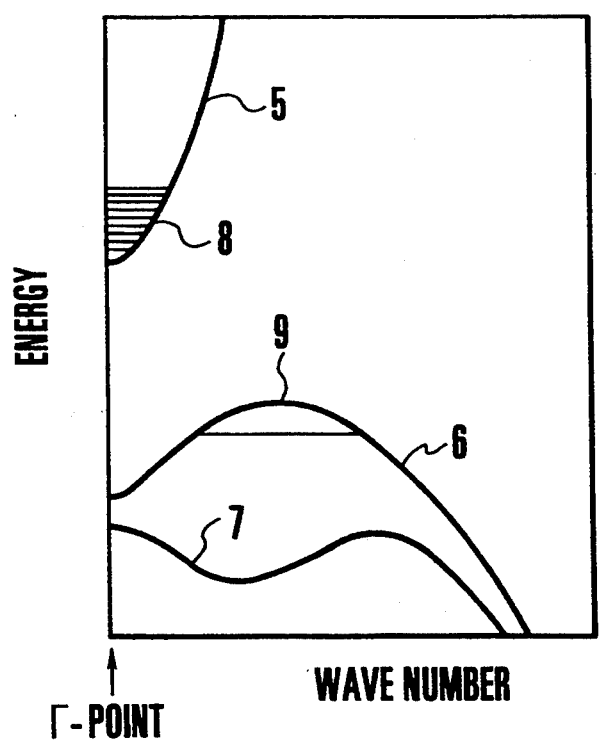
FIG. 2 is a view showing the band structure, in a wave number space, of a quantum well layer constituting the refractive index control semiconductor structure shown in FIG. 1.
Figure 5:
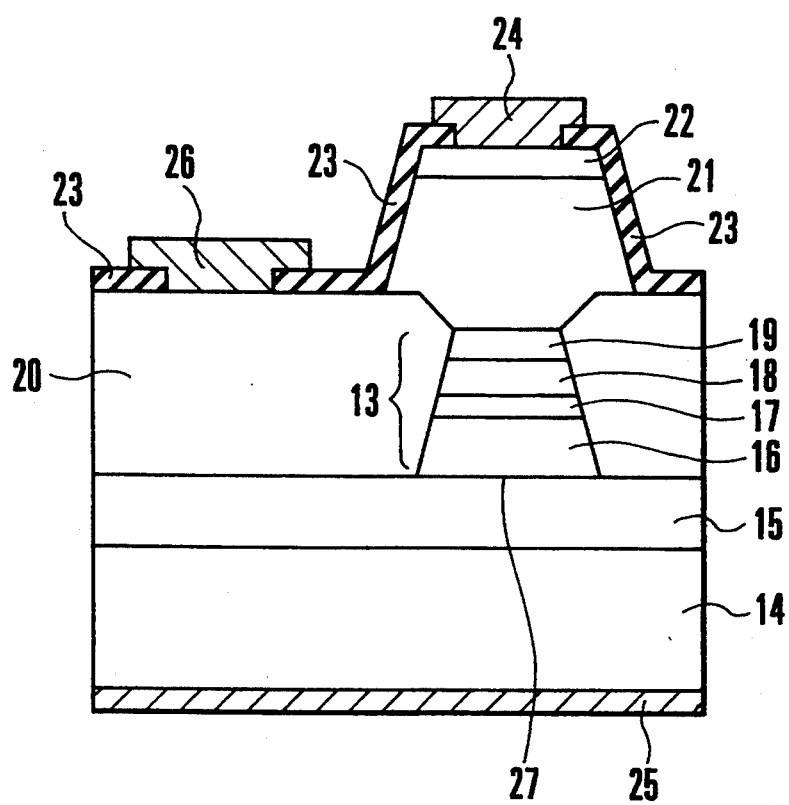
FIG. 5 is a sectional view showing the structure of a tunable semiconductor laser.
Figure 6:
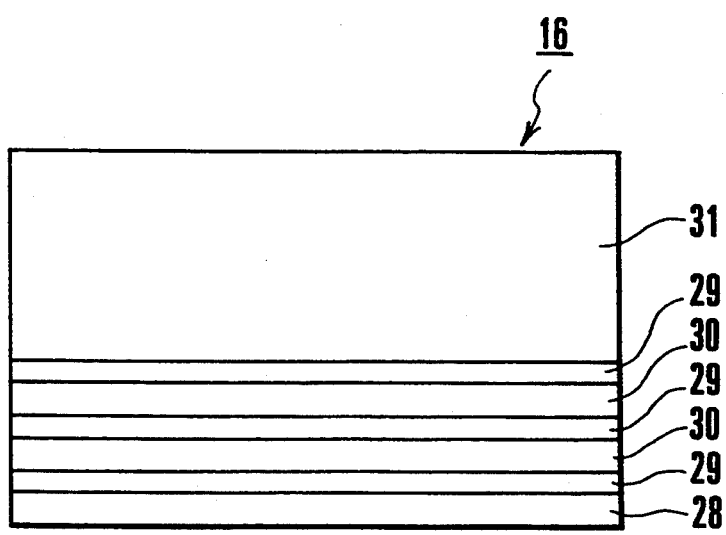
FIG. 6 is a view showing the layer structure of the conventional refractive index control semiconductor structure.

FIG. 1 shows the layer structure of a wavelength tuning layer according to the present invention. The wavelength tuning layer is constituted by an InGaAsP guide layer 1 having a thickness of 20 nm and a bandgap wavelength of 1.2 μm, a seven-period multi-quantum well structure having, as one period, an $In_{0.4}Ga_{0.6}As$ quantum well layer 2 having a thickness of 4.3 nm and an InGaAsP barrier layers 3 having a thickness of 10 nm and a bandgap wavelength of 1.2 μm, and an InGaAsP guide layer 4 having a thickness of 20 nm and a bandgap wavelength of 1.2 μm and formed on the multi-quantum well structure. The optical confinement coefficient of the entire wavelength tuning layer with respect to light having a wavelength of 1.55 μm is about 0.25. This coefficient is almost equal to that of the conventional wavelength tuning layer. The wavelength tuning layer according to the present invention is used as the wavelength tuning layer 16 of the tunable semiconductor laser in FIG. 5. The quantum well layer 2 has a lattice constant smaller than that of the p-type InP substrate 14 in FIG. 5, and a tensile distortion of 0.9% acts on the quantum well layer 2. In this case, with respect to a hole band edge at the Γ-point in the quantum well layer 2, the energy of a light hole band edge becomes higher than that of a heavy hole band edge by about 60 meV. When the thickness of the quantum well layer 2 is properly selected, a sub-band energy obtained by a quantum effect can be changed, and the lowest light hole sub-band energy becomes nearly equal to the lowest heavy hole sub-band energy. At this time, the sub-band structure of lowest electrons and holes of the quantum well layer 2 in a wave number space is shown in FIG. 2. Although an electron sub-band 5 is plotted in the parabolic form, a first hole sub-band 6 is plotted in a shape having a saddle portion. A second hole sub-band 7 has a structure having a curvature reverse to that of the first hole sub-band 6 at the Γ-point. This is because a band mixture between light holes and heavy holes becomes very strong in this structure. When electrons and holes are injected, electrons 8 are distributed at a position near the Γ-point, and holes 9 are distributed at a position having a wave number different from that of the Γ-point.

Figure 3:
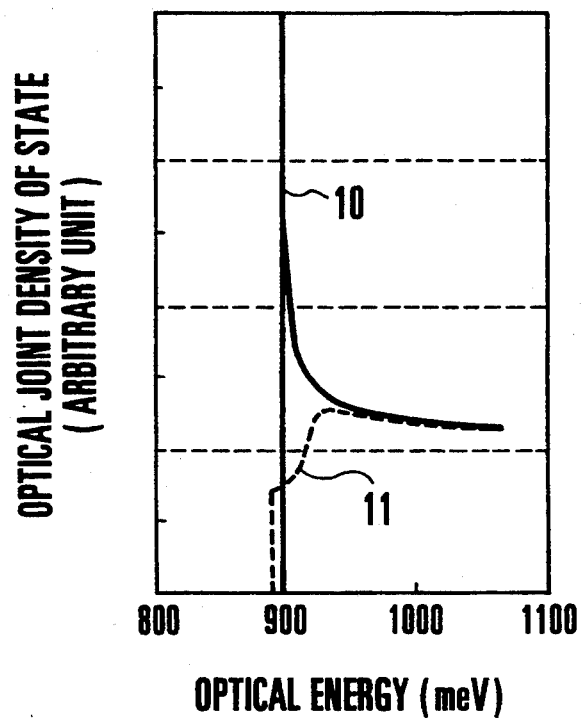
FIG. 3 is a graph showing the relationships between the optical joint density of state and optical transition energy of the quantum well layer constituting the refractive index control semiconductor structure shown in FIG. 1 and those of a quantum well layer constituting a conventional refractive index control semiconductor structure.
Figure 4:
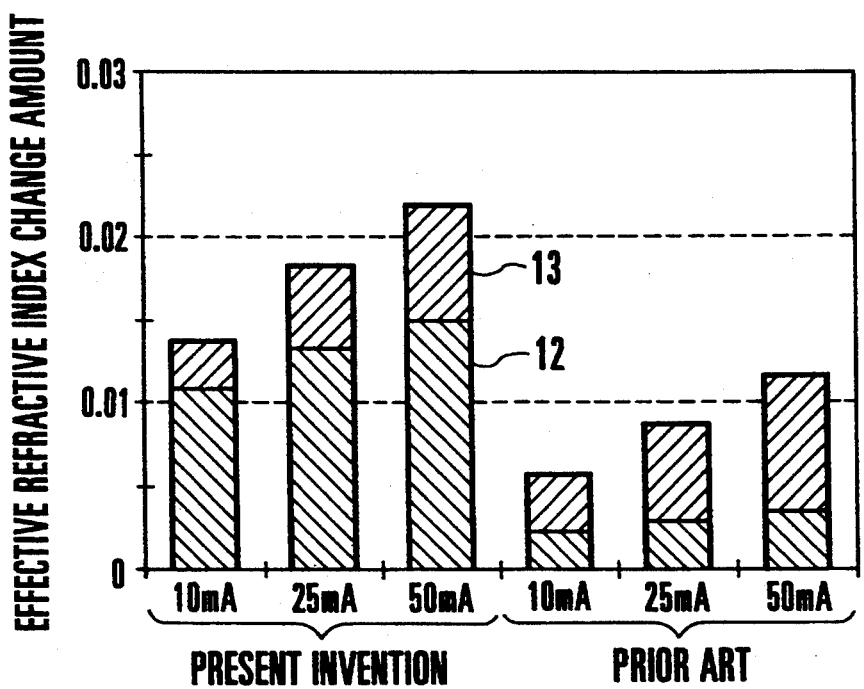
FIG. 4 is a graph in which a calculated effective refractive index change amount, with respect to light having a wavelength of 1.55 μm, of the refractive index control semiconductor structure of FIG. 1 is compared with a calculated effective refractive index change amount, with respect to light having a wavelength of 1.55 μm, of the conventional refractive index control semiconductor structure.

FIG. 3 shows the relationships between the optical joint density of state and optical transition energy of the quantum well layer 2 of the present invention and those of the quantum well layer 29 of the prior art. In the quantum well layer 2 according to the present invention, a density 10 of state is plotted along a curve which projects to have a peak near a position where the minimum optical transition energy is obtained, and a density 11 of state is plotted along a curve which has a stepwise shape near a position where the minimum optical transition wavelength is obtained in the quantum well layer 29 of the prior art. FIG. 4 shows the relationship between a current injection amount and the effective refractive index change amount of the wavelength tuning layer with respect to light having a wavelength of 1.55 μm. An effective refractive index change is obtained by multiplying the refractive index change of the tuning layer by the optical confinement coefficient of the tuning layer. This is given by the difference between an effective refractive index obtained when no current is injected and an effective refractive index obtained when a predetermined current is injected. This calculation was performed as follows. That is, a refractive index change was calculated by changing a carrier density, and a carrier lifetime with respect to a carrier density was set constant independently of the structure and converted into a current density. As the carrier density dependency of the carrier lifetime, an experimental value with respect to an InGaAsP layer having a bandgap wavelength of 1.3 μm was used. A wavelength tuning layer according to the present invention has an anomalous dispersion component 12 which is about five times that of the wavelength tuning layer of the prior art, a plasma dispersion component 13 which is almost equal to that of the wavelength tuning of the prior art, and a total effective refractive index change amount which is almost 2.5 to 2 times that of the wavelength tuning of the prior art. When a current injection amount decreases, the ratio of the effective refractive index change amount of the present invention to the effective refractive index change amount of the prior art increases accordingly. A wavelength change amount obtained when a current of 50 mA is injected becomes 6 nm which is twice the value of the prior art. In addition, in the wavelength tuning layer according to the present invention, the current value in FIG. 4 actually decreases due to the following reasons. As shown in FIG. 2 showing the band structure, when electrons and holes are injected, electrons 8 are distributed at a position near the Γ-point, and holes 9 are distributed at a position having a wave number different from that of the Γ-point. According to the wave number selection rule of optical transition, the recombination probability of electrons and holes having different wave numbers is very low. When a carrier injection amount increases, some electrons and holes are distributed in areas having the same wave number. However, assuming that the same carrier density is used, the carrier lifetime of the wavelength tuning layer of the present invention is longer than that of the prior art. For these reasons, since a wavelength tuning current becomes smaller than that of the prior art, an influence of heat generation of the element decreases. Even when a wavelength tuning amount is larger, decrease of a laser output is reduced.

More specifically, when a tensile distortion acts on a quantum well layer, and the thickness of the quantum well layer is set such that the lowest heavy hole sub-band and lowest light hole sub-band of the quantum well layer have the same energy at the Γ-point, the structure of the lowest hole sub-band in the wave number space has a saddle portion at the Γ-point. The optical joint density of state of the quantum well having the above band structure increases to have a peak at a position where the minimum optical transition energy is obtained. When carriers are injected into such a quantum well, an anomalous dispersion component in a refractive index change considerably increases because absorption is saturated by band filling. In addition, in carrier injection, since electrons and holes are distributed at different positions in the wave number space, respectively, the recombination probability of electrons and holes is low, and the carrier lifetime can be prolonged. Therefore, the carrier density can be largely changed with a small current. For these reasons, the refractive index can be largely changed with a small current.

As has been described above, when the wavelength tuning layer according to the present invention is used, a tunable semiconductor laser can be obtained in which a large wavelength tuning amount can be obtained with a small current value and a decrease in laser output caused by wavelength tuning is small. Note that the refractive index control semiconductor structure of the present invention is not only used as the tuning layer of a tunable semiconductor laser but also used as the active layer of a refractive index control optical modulator which is operated such that a refractive index is controlled by current injection.

What is claimed is:

1. A refractive index control optical semiconductor device comprising:

a semiconductor p-n junction structure for outputting light with a forward current; and a refractive index control semiconductor layer which is formed on a semiconductor substrate, is stacked on said semiconductor p-n junction structure to constitute an optical waveguide, causes a change of refractive index of light to occur by carrier injection, and includes a multi-quantum well structure formed by alternately stacking a semiconductor quantum well layer and a barrier layer having a bandgap larger than that of said semiconductor quantum well layer at a plurality of periods, said semiconductor quantum well layer having a lattice constant smaller than that of said semiconductor substrate, and a thickness of said semiconductor quantum well layer being set such that a lowest heavy hole sub-band and a lowest light hole sub-band of said semiconductor quantum well layer have nearly the same energy at a Γ-point in a wave number space.

2. A device according to claim 1, wherein said semiconductor quantum well layer has a thickness of 4.3 nm.

3. A device according to claim 1, wherein said multi-quantum well structure is constituted by stacking said semiconductor quantum well layer and said barrier layer at seven periods.

4. A device according to claim 1, wherein said semiconductor p-n junction structure has a mesa-shaped double heterostructure in which an active layer is vertical sandwiched by cladding layers to output a laser beam and comprises a diffraction grating formed on a facet of said optical waveguide in a laser resonance direction to select an oscillation wavelength, and said refractive index control optical semiconductor device is a tunable semiconductor laser in which an optical pitch of said diffraction grating changes due to a refractive index change of said refractive index control semiconductor layer serving as a wavelength tuning layer to change a laser oscillation wavelength.

5. A refractive index control optical semiconductor structure comprising a refractive index control semiconductor layer which is formed on a semiconductor substrate to constitute part of an optical waveguide, causes a change of refractive index of light to occur by carrier injection, and includes a multi-quantum well structure formed by alternately stacking a semiconductor quantum well layer and a barrier layer having a bandgap larger than that of said semiconductor quantum well layer at a plurality of periods, said semiconductor quantum well layer having a lattice constant smaller than that of said semiconductor substrate, and a thickness of said semiconductor quantum well layer being set such that a lowest heavy hole sub-band and a lowest light hole sub-band of said semiconductor quantum well layer have nearly the same energy at a Γ-point in a wave number space.

* * * * *